United States Patent [19]
Kim et al.

[11] Patent Number: 5,105,252
[45] Date of Patent: Apr. 14, 1992

[54] LOW VOLTAGE BICMOS AND HIGH VOLTAGE BICMOS ON THE SAME SUBSTRATE

[75] Inventors: Dong J. Kim, Kyungsangbuk; Jun Eui Song, Seoul, both of Rep. of Korea

[73] Assignee: Samsung Electronics Co., Ltd., Suweon, Rep. of Korea

[21] Appl. No.: 727,422

[22] Filed: Jul. 9, 1991

[30] Foreign Application Priority Data

Apr. 9, 1991 [KR] Rep. of Korea .................. 91-5632

[51] Int. Cl.$^5$ .................. H01L 27/02; H01L 29/10; H01L 29/72
[52] U.S. Cl. .................. 357/43; 357/42; 357/234; 357/34; 357/40
[58] Field of Search .................. 357/43, 42, 23.14, 23.1, 357/34, 40

[56] References Cited

U.S. PATENT DOCUMENTS 4,628,341 12/1986 Thomas .................. 357/43
4,697,202 9/1987 Shen .................. 357/43

*Primary Examiner*—ROlf Hille
*Assistant Examiner*—Wael Fahmy
*Attorney, Agent, or Firm*—Ladas & Parry

[57] ABSTRACT

The present invention relates to a semiconductor device which has not only high performance memory and logic by forming the low voltage and high voltage BiCMOS transistors in the same single semiconductor substrate,but also various functions and driving voltages by increasing the output power and noise margin, wherein the miniaturization of electronic products can be achieved by forming the low and high voltage BiCMOS transistors with various functions and also can achieve the high speed operation since a signal processing speed becomes fast.

3 Claims, 5 Drawing Sheets

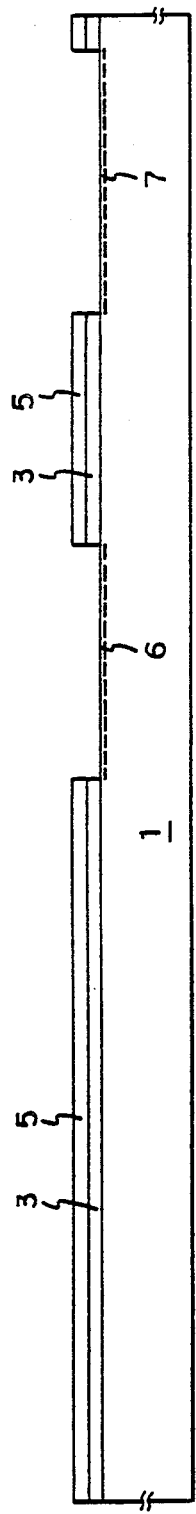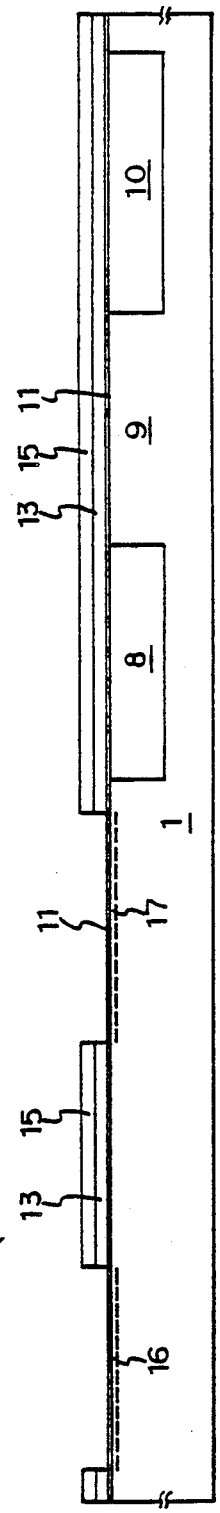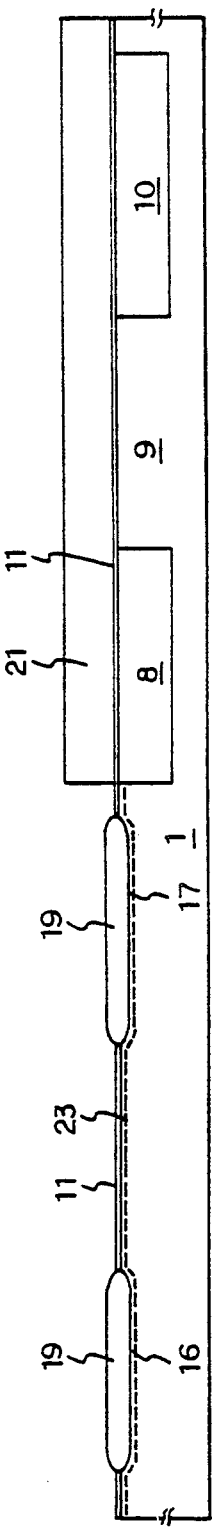
FIG. 2(A)
FIG. 2(B)
FIG. 2(C)

LOW VOLTAGE BICMOS AND HIGH VOLTAGE BICMOS ON THE SAME SUBSTRATE

BACKGROUND OF THE INVENTION

The present invention relates to a semiconductor device and a method of manufacturing thereof and, more particularly, to the incorporation of both low and high voltage BiCMOS elements in one chip.

Recently, according to the high-speed and miniaturization trend of electronic products, the developments of semiconductor devices with multi-function which compose semiconductor elements with different functions and different driving voltages in one chip have been completed.

Generally, the semiconductor device which has bipolar transistor and CMOS transistor within one chip is called BiCMOS. The conventional BiCMOS of VLSI(Very Large Scale Integrated Circuit) level has been suitable for high integration and high speed logic since they have been designed for high performance memory and logic driven by a low voltage as introduced in ISSCC Digest of Technical Papers, February, 1986, p. 212 and CICC Tech. Dig., May 1986, p. 68.

Also, BiCMOS which is driven by a high voltage to increase output power and noise margin has been developed. However, there is a problem in achieving the high speed operation and miniaturization of electronic products, since such electronic products which use both the low and high voltage BiCMOS have to be loaded with many semiconductor devices and so there are difficulties in achieving the high speed operation and miniaturization of such electronic products.

SUMMARY OF THE INVENTION

The present invention has an object to provide a semiconductor device which incorporates the low and high voltage BiCMOS devices in one chip to achieve the high speed operation and miniaturization.

Another object of the present invention is to provide a method for manufacturing the semiconductor device which incorporate the low and high voltage BiCMOS devices in one chip to achieve the high speed operation and miniaturization.

According to the first aspect of the present invention, there is provided a semiconductor device, the device comprising:

a high voltage BiCMOS element composed of seventh and ninth regions of a lightly-doped second conductive type formed on one side of a semiconductor substrate, an eighth region of a lightly-doped first conductive type formed between the seventh and ninth regions, first, second and third regions of the lightly-doped same conductive type those of seventh, eighth, and ninth regions contacted with the bottoms of the seventh, eighth, and ninth regions, source/drain regions having a heavily-doped region and a lightly-doped regions, the heavily-doped region is formed on a predetermined part of the seventh and eighth regions with opposite conductive type to that of the seventh and eighth regions, a first polysilicon layer formed on the surface between the source and drain regions after insertion of a first gate oxide layer, source/drain electrodes and a gate electrode contacted electrically with the source/drain regions and the first polysilicon layer, contact electrodes for applying a substrate bias to the seventh and eighth regions, a base region of a lightly-doped first conductive type formed on a predetermined surface of the ninth region, an emitter region of a heavily-doped second conductive type formed on the base region, a collector region of the heavily-doped second conductive type formed over the third region, separated from said base region by a field oxide, and an emitter electrode, a collector electrode, and a base electrode contacted electrically with the emitter, collector, and base regions; and a low voltage BiCOMS element composed of tenth and twelfth regions of a lightly-doped second conductive type formed at another side of the first conductive type semiconductor substrate, an eleventh region of the lightly-doped first conductive type formed between the tenth and twelfth regions, a fourth, a fifth and a sixth regions of a highly-doped the first conductive type contacted with the bottoms of said tenth, eleventh, and twelfth regions, source and drain regions formed at predetermined parts of the tenth and eleventh regions, a second polysilicon layer formed on the surface between the source and drain regions after insertion of a second gate oxide layer, a source electrode, a drain electrode, and a gate electrode contacted electrically with the source and drain regions and the second polysilicon layer, contact electrodes for applying a substrate bias to the tenth and eleventh regions, a base region of the lightly-doped first conductive type formed on the predetermined surface of the twelfth region, and an emitter region of the heavily-doped second conductive type formed on the base region, a collector region of the heavily-doped second conductive type formed in contact with the sixth region, separated from the base region by the field oxide, and an emitter electrode, a collector electrode, and a base electrode contacted electrically with the emitter, collector and base.

According to the second aspect of the present invention, there is provided a method for manufacturing a semiconductor device, the method comprising:

forming ion-implanted regions so as to make first and third regions of a lightly-doped second conductive type at a predetermined part of one side of a first conductive type semiconductor substrate, forming ion-implanted regions so as to make a fifth region of a heavily-doped first conductive type between fourth and sixth regions of a heavily-doped second conductive type at a predetermined part of another side of the first conductive type semiconductor substrate, forming first to sixth regions by activation of impurities in the ion-implanted regions, forming an epitaxial layer on the entire surface of the structure, forming ion-implanted regions of a lightly-doped second conductive type at the epitaxial layer on the first and third regions, forming ion-implanted regions of a lightly-doped second conductive type at the epitaxial layer on the fourth and sixth regions, forming ion-implanted regions of a lightly-doped first conductive type at the epitaxial regions of the third and fifth regions, forming seventh to twelfth regions on the first to sixth regions by activation of impurities in the ion-implanted regions, implanting the impurities of a heavily-doped second conductive type into a predetermined part of the ninth and twelfth regions to form a collector region of a bipolar transistor, implanting the impurities of a lightly-doped first conductive type and a lightly-doped second conductive type into the predetermined parts of the seventh and eight regions to form lightly-doped source and drain regions of a high voltage MOS transistor, forming a first thick oxide layer on said seventh and eighth regions, followed by formation of a first polysilicon layer above the first thick oxide layer, forming a second oxide layer on the tenth and eleventh regions, followed by formation of a second polysilicon layer above said second oxide layer, forming ion-implanted regions for source and drain regions of high and low voltage first and second conductive type MOS transistors and for emitter and base regions of high and low voltage bipolar transistors, activating the impurities in the ion-implanted regions, and forming electrodes.

DETAILED DESCRIPTION OF THE INVENTION

The present invention will be now described in more detail with reference to the accompanying drawings.

Figure 1:
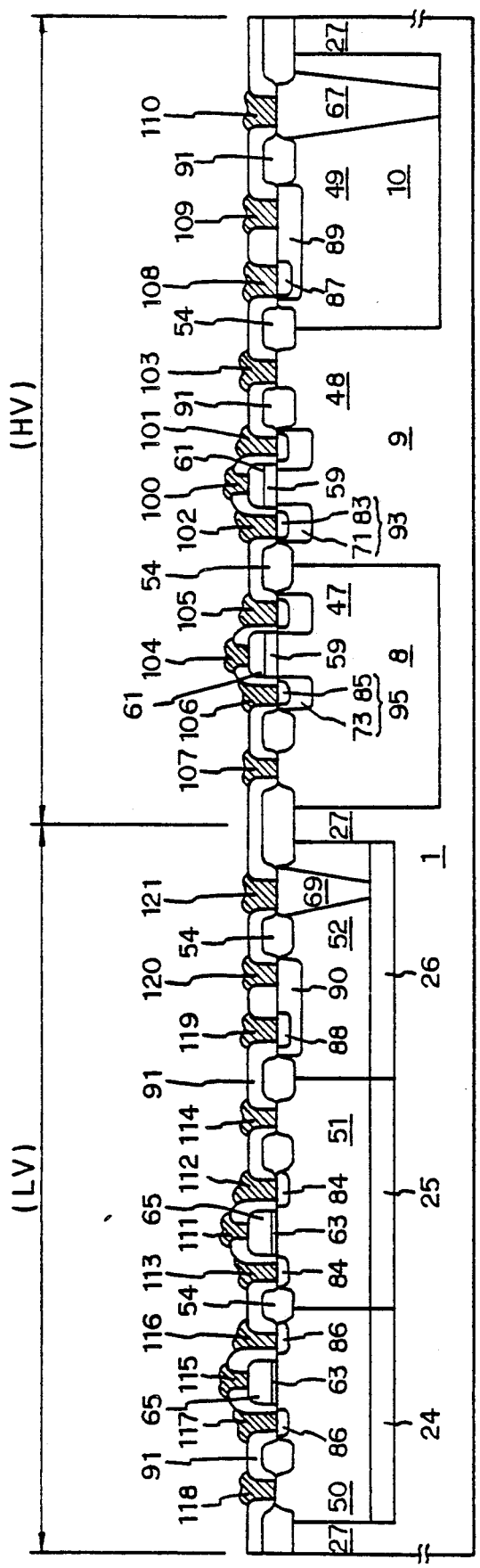
FIG. 1 is a cross sectional view of a semiconductor device according to the present invention.

FIG. 1 shows a cross-sectional view of a semiconductor device where both low voltage BiCMOS and high voltage BiCMOS are formed of in one chip.

First, a p-type semiconductor substrate 1 is divided into two regions: a low voltage (LV) region and a high voltage (HV) region. In the LV region is formed of a low voltage BiCMOS, while in the HV region is formed of a high voltage BiCMOS. Tenth, eleventh, twelfth regions 50, 51 and 52 of a lightly-doped impurities of 1.5~2.5 μm in thickness are formed in the LV region. The tenth and eleventh regions 50 and 51 are N-type and P-type wells, respectively, where LV PMOS and NMOS transistors are formed. On the other hand, the twelfth region 52 is a N-type well, where a LV NPN bipolar transistor is formed.

At the surface of the tenth region 50, source and drain regions 86 of a PMOS transistor are formed, and subsequencly on the surface of these source and drain regions, source and drain electrodes 116 and 117 are formed.

A second polysilicon layer 65 is formed on the surface between the source and drain regions after insertion of a second gate oxide layer 63, and on this second polysilicon layer 65, a gate electrode 115 is formed. Also, a contact electrode 118 for applying a proper substrate voltage to the tenth region 50 is separatd from the aforementioned PMOS transistor by a field oxide layer 54.

An NMOS transistor is formed at the eleventh region 51 and a contact electrode 14 is formed, separated from this NMOS transistor by the field oxide 54. The PMOS transistor is also separated from the NMOS transistor by the field oxide 54.

A base region 90 of a NPN bipolar transistor is formed at a part of the surface of the twelfth region 52, and in this base region an emitter region 88 is formed. Also, a collector region 88 is formed at the other part of the surface of the twelfth region 52, separated from the base region 90 by the field oxide 54.

Beneath the tenth, eleventh, and twelfth regions 50, 51 and 52, heavily-doped same conductive type fourth, fifth, and sixth regions 24, 25 and 26 are formed, respectively.

The fourth and fifth regions 24 and 25 are used to prevent the latch-up of the PMOS and NMOS transistors, respectively, while the sixth region 52 is used as a buried layer for the NPN bipolar transistor. The fifth region 25 further improves the integration density by electrically separating the fourth region 24 and the sixth region 26.

On the other hand, in the HV region, lightly-doped seventh, eighth, and ninth regions 47, 48 and 49 are formed of 1.5~2.5 μm in thickness. Beneath these regions, lightly-doped same conductive type first, second, and third regions 8, 9 and 10 are formed of 3.5~5 μm in thickness. The first and seventh regions 8 and 47, in which the PMOS transistor is formed, are N-type wells and has a high breakdown voltage since it is lightly-doped. Source and drain regions the PMOS transistor 95 are formed at the surface of the seventh region 47.

These source and drain regions 95 are formed of highly doped first P-type region 85 surrounded by lightly doped first P-type region 73 for preventing the destruction when a high voltage is applied. Over the surface between source and drain regions 95, a first polysilicon layer 61 is formed after insertion of a first gate oxide layer 59. The first gate oxide 59 is formed of 500~1500 Å in thickness. On the surface of the heavily-doped region 85, source and drain electrodes 105 and 106 are formed.

Also, a gate electrode 104 is formed on the first polysilicon layer 61. A contact electrode 107 for applying the substrate voltage to the tenth region 47 is separated from the PMOS transistor by the field oxide 54. The above mentioned PMOS transistor is prevented from the destruction though a high voltage which is applied to the first gate electrode since it is depleted to the first region 8.

Also, the second and eight regions 9 and 48 are to be the regions where the NMOS transistor is formed, and this NMOS transistor is separated from the PMOS transistors by the field oxide layer 54.

The third and ninth regions 10 and 49 are the regions where a high voltage NPN bipolar transistor is formed, and this high voltage NPN transistor has the same structure as that of the low voltage NPN bipolar transistor except that the high voltage NPN bipolar transistor has the third region 10 instead of the buried layer. Further, the collector region 67 is formed over the third region 10. The high voltage NPN depleted to the third region 10 when the high voltage is applied.

Figure 2:
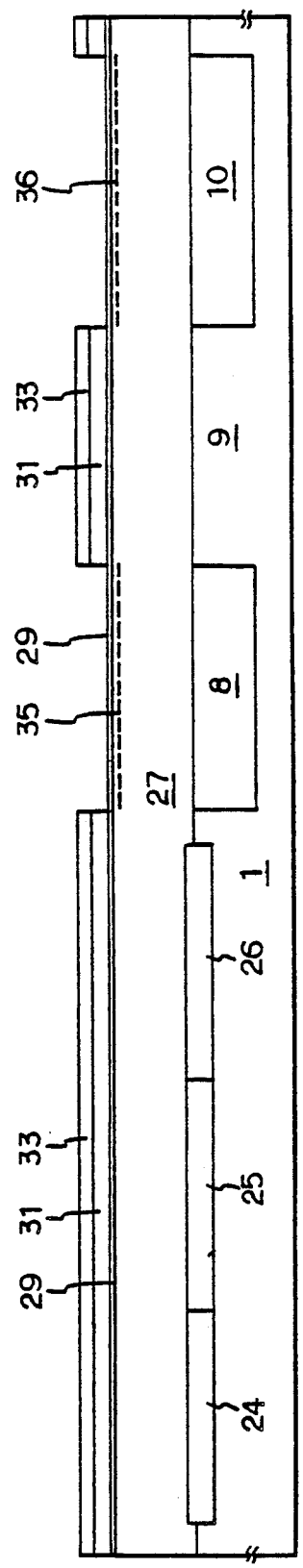
FIGS. 2(A) to 2(I) are schematic cross-sectional views illustrating the manufacturing steps of a semiconductor device for explaining the method according to the present invention.
Figure 2:
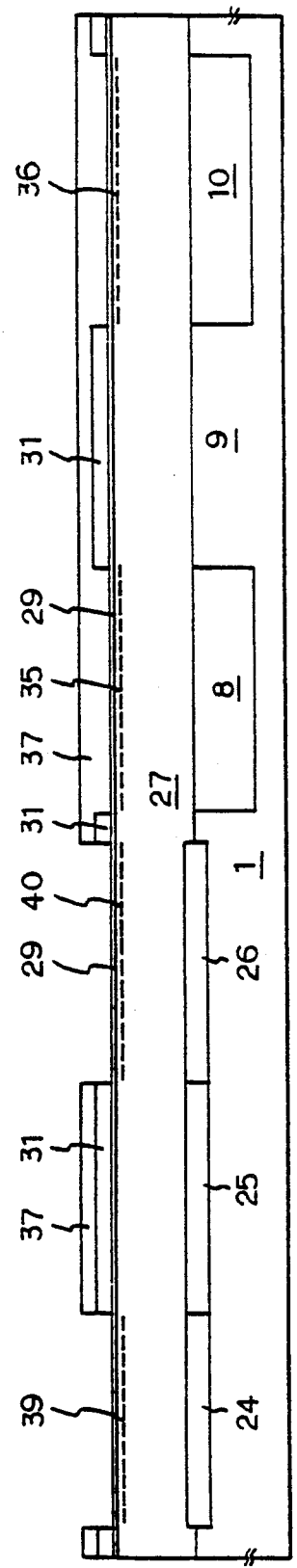
Figure 2:
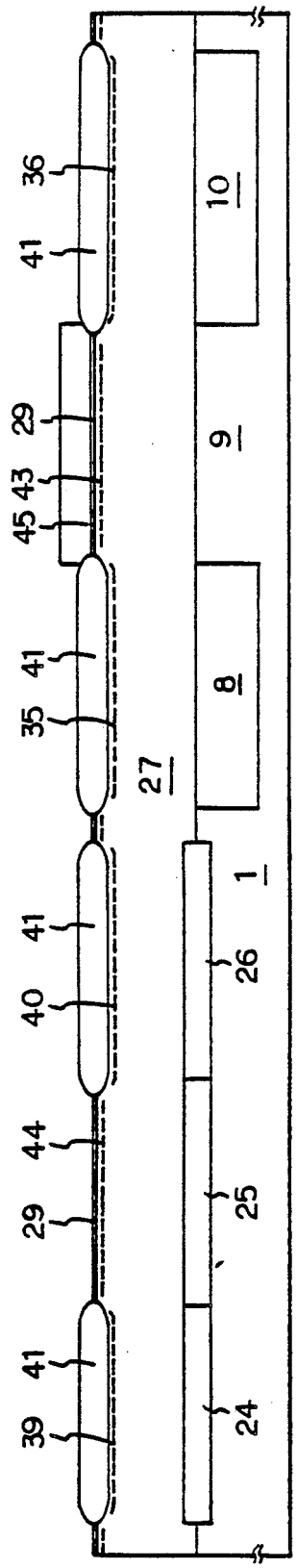
Figure 2:
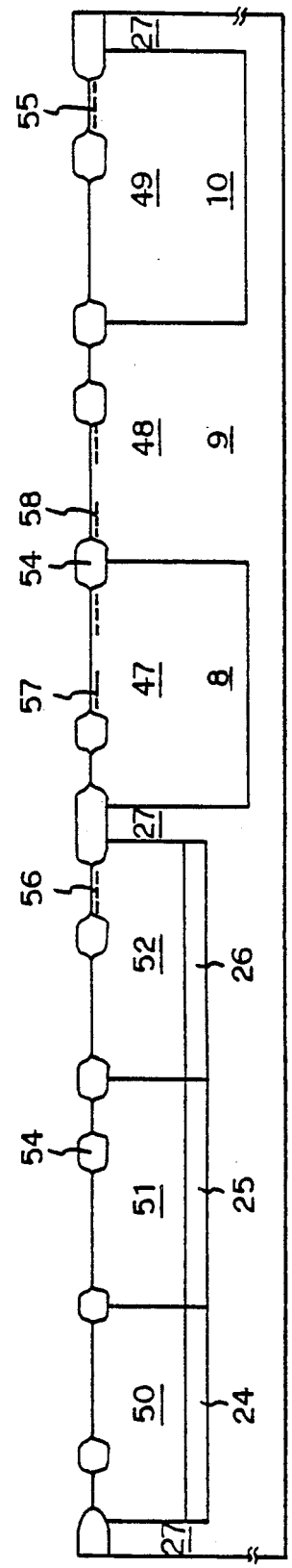

FIGS. 2(A)-2(I) show the manufacturing steps of the device as shown in FIG. 1. Referring to FIG. 2(A), a first pad oxide layer 3 of 4000 Å in thickness and a first photoresist layer 5 are formed on a p-type semiconductor substrate 1 with a <100> orientation and a resistivity of $2\sim 20\Omega.\text{cm}$.

Next, the HV region of the semiconductor substrate 1 is exposed by the conventional photolithography process and the first ion-implanted regions 6 and 7 are formed by ion-implant of the N-type impurities with a dose of $1\times 10^{13}\sim 1\times 10^{14}/\text{cm}^2$ at about 180 Kev.

Referring to FIG. 2(B), after removing the first pad oxide layer and the first photoresist layer 5, first and third N-type regions 8 and 10 of $3.5\sim 5$ $\mu$m where PMOS and NPN bipolar transistors are to be formed, are formed by activation of the impurities in the ion-implanted regions 6 and 7. The substrate between the first and third regions 8 and 10 becomes a ninth region 9 where an NMOS transistor is to be formed.

In the next step, after a second pad oxide layer 11 of $200\sim 200$ Å, a first nitride layer 13 of $1000\sim 1500$ Å, and a second photoresist layer 15 are sequentially formed on the entire surface of the semiconductor substrate 1, a predetermined part of the second pad oxide layer 11 on the LV region is exposed by the conventional photolithography process.

Subsequently, the N-type impurity such as arsenic is implanted with a dose of $1\times 10^{15}\sim 1\times 10^{16}/\text{cm}^2$ at about 100 Kev to form second ion-implanted regions 16 and 17.

Referring to FIG. 2(C), after removing the second photoresist layer 15, a thick third pad oxide layer 19 is formed by thermal oxidation of the exposed part of the second pad oxide layer 11, by using the first nitride layer 13 as a mask.

Subsequently, a third photoresist layer 21 is formed on the HV region after removing the first nitride layer 13, and a third ion-implanted region 23 is formed by implanting the P-type impurity such as boron onto the entire surface of the structure with a dose of $1\times 10^{13}\sim 1\times 10^{14}/\text{cm}^2$ at about 80 Kev.

Referring to FIG. 2(D), after removing the third photoresist layer 21, highly doped N-type fourth and sixth regions 24 and 26 and P-type fifth region 25 are formed by activation of the impurities in the ion-implanted regions 16, 17 and 23.

Next, an epitaxial layer 27 of $1.5\sim 2.5$ $\mu$m in thickness is formed on the entire surface after removing the second and third pad oxide layers 11 and 19. After formation of a fourth pad oxide layer 29, a second nitride layer 31, and a fourth photoresist layer 33 on the epitaxial layer 27, the fourth pad oxide layer 27 on the first and third regions 8 and 10 are exposed by the conventional photolithography process.

Next, fourth ion-implanted regions 35 and 36 are formed by implantation of phosphorous on the entire surface of the structure with a dose of $5\times 10^{11}\sim 5\times 10^{12}/\text{cm}^2$ at 180 Kev.

Referring to FIG. 2(E), a fifth photoresist layer 37 is again formed after removal of the fourth photoresist layer 33. In the next step, after the fourth pad oxide layer 29 on the fourth and sixth regions 24 and 26 is exposed by the conventional photolithography process, fifth ion-implanted regions 39 and 40 are formed by implantation of phosphorus with a dose of $1\times 10^{12}\sim 1\times 10^{13}/\text{cm}^2$ at 180 Kev.

Referring to FIG. 2(F), after removal of the fifth photoresist layer 37, a thick fifth pad oxide layer 41 is formed by thermal oxidation of the exposed part of the fourth pad oxide layer 29.

After removal of the second nitride layer 31, sixth and seventh regions 43 and 44 are formed on the secondd and fifth regions 9 and 25 by implantation of boron with a dose of $5\times 10^{11}\sim 5\times 10^{12}/\text{cm}^2$ at 60 Kev. Subsequently, after forming a sixth photoresist layer 45 on the sixth ion-implanted region 43 by the conventional way, the impurity concentration in the seventh ion-implanted region 44 is increased by additional implantation of the impurity such as boron with a dose of $5\times 10^{11}\sim 5\times 10^{12}/\text{cm}^2$ to 60 Kev.

Referring to FIG. 2(G), after removing the sixth photoresist layer 45, the seventh to twelfth regions 47, 48, 49, 50, 51 and 52 are formed by activation of the impurities in the fourth to seventh ion-implanted regions 35, 36, 39, 40, 43 and 44.

Next, after forming the field oxide layer 54 by the conventional LOCLD (Local Oxidation of Silicon), eighth and ninth ion-implanted regions 55 and 56 for forming the collector regions of low voltage and high voltage NPN bipolar transistor are formed by the conventional implantation of phosphorous with a dose of $1\times 10^{15}\sim 1\times 10^{16}/\text{cm}^2$ at 140 Kev.

In the next step, tenth and eleventh ion-implanted regions 57 and 58 are formed on the predetermined parts of the tenth and eleventh regions 47 and 48 by the same method as described above. The tenth and eleventh regions 57 and 58 are respectively formed by two-step ion-implantation of boron and phosphorous with a dose of $1\times 10^{12}\sim 1\times 10^{13}/\text{cm}^2$ at 60 Kev.

Figure 2H:
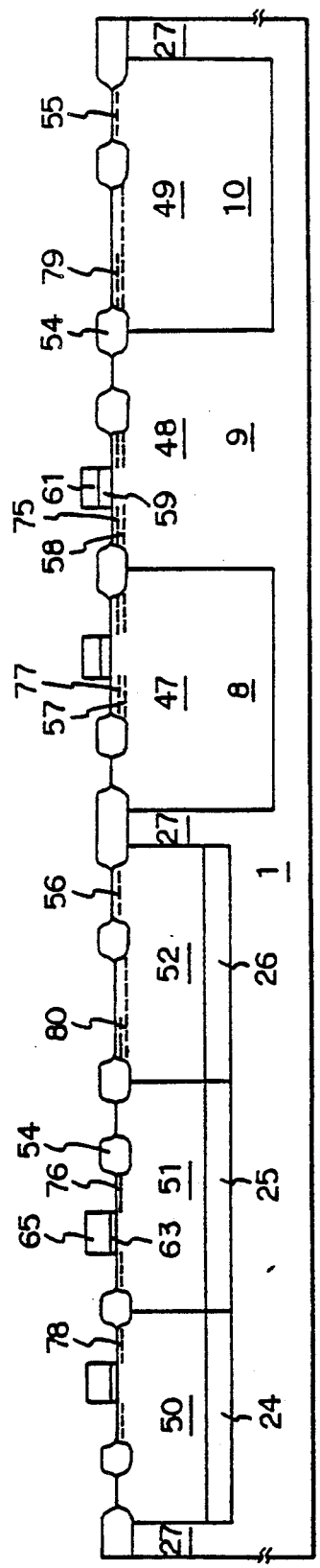

Referring to FIG. 2(H), first gate oxide 59 and first polysilicon layer 61 of $500\sim 1500$ Å are formed on the surface between the tenth and eleventh ion-implanted regions 57 and 58 by the conventional method. Subsequently, the second gate oxide layer 63 and second polysilicon layer 65 of $200\sim 500$ Å are formed on the predetermined parts of the tenth and eleventh regions 50 and 51.

In the next step, twelfth and thirteenth ion-implanted regions 75 and 76 are formed on the predetermined parts of the eighth and eleventh regions 48 and 51 by implantation of phosphorus with a dose of $1\times 10^{15}\sim 5\times 10^{15}/\text{cm}^2$ at 60 Kev. Subsequently, fourteenth and fifteenth ion-implanted regions 77 and 78 are formed on the predetermined parts of the seventh and tenth regions 47 and 50 by implantation of boron with a dose of $1\times 10^{16}\sim 5\times 10^{15}/\text{cm}^2$ at 60 Kev.

At this time, sixteenth and seventeenth ion-implanted regions 79 and 80 for forming the emitter regions of the low and high voltage NPN bipolar transistors are formed on the ninth and twelfth regions 49 and 52.

In the next step, eighteenth and nineteenth ion-implanted regions 81 and 82 for forming the base regions of the low and high voltage NPN bipolar transistors on the predetermined parts of the ninth and twelfth regions 49 and 52 are formed, overlapped with the sixteenth and seventeenth ion-implanted regions 79 and 80 at the predetermined parts.

Figure 2I:
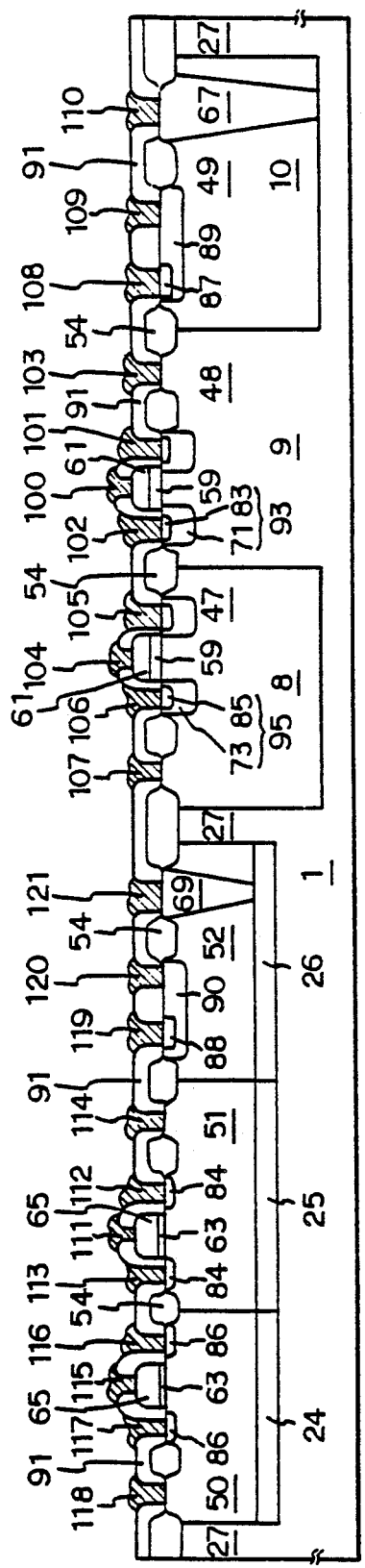

Referring to FIG. 2(I), the impurities of the eighth to nineteenth ion-implanted regions 56, 57, 58, 59, 75, 76, 77, 78, 79, 80, 81 and 82 are activated. Thus, the eighth and ninth regions 56 and 57 become the collector regions 67 and 69 of the low and high voltage NPN bipolar transistors, while the tenth and eleventh regions 58 and 59 become the lightly-doped first and second regions 71 and 73 for forming the source and drain regions of the high voltage PMOS and NMOS transistors.

Also, the twelfth fourteenth ion-implanted regions 75 and 77 become heavily-doped first and second regions 83 and 85 to form the source and drain regions of the high voltage PMOS and NMOS transistors, together with the lightly-doped regions 71 and 73. Also the thirteenth and fifteenth ion-implanted regions 76 and 78 become the source and drain regions of the low voltage PMOS and NMOS transistors, while the sixteenth-~nineteenth ion-implanted regions 79, 80, 81 and 82 become the emitter and base regions of the low and high voltage NPN bipolar transistors.

After formation of an oxide layer 91 on the entire surface by the conventional CVD method, windows for forming electrodes are formed. Finally, after formation of a metal layer on the entire surface of the structure, electrodes 100 to 21 are formed by the conventional photolithography process.

As mentioned until now, since the high voltage and low voltage BiCMOS transistors are formed in the same semiconductor substrate, the present invention can have not only the high performance memory and logic but also the various functions and various driving voltages due to the increase of the output power and noise margin.

Thus, the present invention can achieve the miniaturization of the electronic products by forming the high voltage and low voltage BiCMOS transistors in one chip and can achieve the high speed operation since the signal processing speed becomes faster.

What is claimed is:

1. A semiconductor device comprising:
   a high voltage BiCMOS element composed of seventh and ninth regions of a lightly-doped second conductivity type formed on one side of a semiconductor substrate,
   an eighth region of a lightly-doped first conductivity type formed between said seventh and ninth regions,
   first, second, and third regions of lightly-doped same conductivity type contacted with the bottoms of said seventh, eighth, and ninth regions,
   source/drain regions having a heavily-doped region, a lightly-doped region surrounding said heavily-doped region, said heavily-doped region being formed on a predetermined part of said seventh and eighth regions with opposite conductivity type to that of said seventh and eighth regions,
   a first polysilicon layer formed on the surface between said source and drain regions after insertion of a first gate oxide layer,
   source/drain electrodes and a gate electrode electrically contacted with said source/drain regions and said first polysilicon layer respectively,
   contact electrodes for applying a substrate bias to said seventh and eighth regions,
   a base region of a lightly-doped first conductivity type formed on a predetermined surface of said ninth region,
   an emitter region of a heavily-doped second conductivity type formed on said base region,
   a collector region of a heavily-doped second conductivity type formed over said third region, separated from said base region by a field oxide, and emitter electrode, collector electrode, and base electrode contacted electrically with said emitter, collector, and base regions; and
   a low voltage BiCMOS element composed of tenth and twelfth regions of a lightly-doped second conductivity type formed on another side of said first conductivity type semiconductor substrate,
   an eleventh region of a lightly-doped first conductivity type formed between said tenth and twelfth regions,
   fourth, fifth and sixth regions of a highly-doped same conductivity type contacted with the bottoms of said tenth, eleventh, and twelfth regions,
   a second polysilicon layer formed on the surface between said source and drain regions after insertion of a second gate oxide layer,
   a source electrode, a drain electrode, and a gate electrode contacted electrically with said source and drain regions, and said second polysilicon layer respectively,
   contact electrodes for applying substrate bias to said tenth and eleventh regions,
   a base region of a lightly-doped first conductivity type formed on a predetermined surface of said twelfth region,
   an emitter region of a heavily-doped second conductivity type formed on said base region,
   a collector region of a heavily-doped second conductivity type formed in contact with said sixth region, separated from said base region by the field oxide, and
   an emitter electrode, a collector electrode, and a base electrode contacted electrically with said emitter, collector and base.

2. The semiconductor device according to claim 1, wherein said first gate oxide is formed of 500~1500 Å in thickness.

3. The semiconductor device according to claim 1, wherein said first, second, and third regions are formed thicker than said fourth, fifth and sixth regions.

* * * * *